US010840226B2

(12) United States Patent
Biwa (10) Patent No.: US 10,840,226 B2
(45) Date of Patent: Nov. 17, 2020

(54) LIGHT-EMITTING APPARATUS (71) Applicant: SONY SEMICONDUCTOR SOLUTIONS CORPORATION, Kanagawa (JP)

(72) Inventor: Goshi Biwa, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 15/761,567

(22) PCT Filed: Sep. 8, 2016

(86) PCT No.: PCT/JP2016/076429
§ 371 (c)(1),
(2) Date: Mar. 20, 2018

(87) PCT Pub. No.: WO2017/061226
PCT Pub. Date: Apr. 13, 2017

(65) Prior Publication Data
US 2018/0342490 A1 Nov. 29, 2018

(30) Foreign Application Priority Data
Oct. 5, 2015 (JP) ................................. 2015-197372

(51) Int. Cl.
H01L 23/538 (2006.01)
H01L 23/52 (2006.01)
(Continued)

(52) U.S. Cl.
CPC ........... H01L 25/13 (2013.01); G09G 3/3225 (2013.01); G09G 3/3233 (2013.01);
(Continued)

(58) Field of Classification Search
CPC ....... H01L 27/15; H01L 33/62; H01L 33/641; H01L 23/49534; H01L 33/647; H01L 23/49805
See application file for complete search history.

(56) References Cited

U.S. PATENT DOCUMENTS 3,926,746 A * 12/1975 Hargis ................ C04B 41/4505
205/128
4,525,597 A * 6/1985 Abe .................... H01L 21/4867
174/557
(Continued)

FOREIGN PATENT DOCUMENTS

CN 102376850 A 3/2012
CN 103258947 A 8/2013
(Continued)

OTHER PUBLICATIONS

International Search Report and Written Opinion of PCT Application No. PCT/JP2016/076429, dated Nov. 8, 2016, 09 pages of ISRWO.
(Continued)

Primary Examiner — Mary A Wilczewski
Assistant Examiner — Tsz K Chiu
(74) Attorney, Agent, or Firm — Chip Law Group (57) ABSTRACT A light-emitting apparatus includes a plurality of packages each including a first substrate, and a single second substrate on which the plurality of packages are arrayed. The first substrate includes a first light source and a second light source. The first light source includes a first light-emitting section that emits light having a first wavelength, and first and second electrodes that are coupled to the first light-emitting section. The second light source includes a second light-emitting section that emits light having a second wavelength, and third and fourth electrodes that are coupled to the second light-emitting section. The second substrate includes
(Continued)

first connection which is coupled to both the first electrode in a first package and the first electrode in a second package, second connection coupled to both the third electrode in the first package and the third electrode in the second package, and a driving circuit.

11 Claims, 11 Drawing Sheets

(51) Int. Cl.
*H01L 25/13* (2006.01)
*G09G 3/3233* (2016.01)
*H01L 25/075* (2006.01)
*G09G 3/3225* (2016.01)
*G09G 3/32* (2016.01)
*G11C 19/28* (2006.01)
*H01L 25/16* (2006.01)
*H01L 27/12* (2006.01)
*H01L 33/54* (2010.01)
*H01L 33/62* (2010.01)

(52) U.S. Cl.
CPC ........... *H01L 25/0753* (2013.01); *G09G 3/32* (2013.01); *G09G 2300/026* (2013.01); *G09G 2300/08* (2013.01); *G09G 2300/0819* (2013.01); *G09G 2300/0842* (2013.01); *G09G 2320/0233* (2013.01); *G09G 2330/02* (2013.01); *G11C 19/28* (2013.01); *H01L 25/167* (2013.01); *H01L 27/124* (2013.01); *H01L 27/1255* (2013.01); *H01L 33/54* (2013.01); *H01L 33/62* (2013.01); *H01L 2224/48091* (2013.01)

(56) References Cited

U.S. PATENT DOCUMENTS

| | | | | |
|---|---|---|---|---|
| 5,665,649 | A * | 9/1997 | Harris | H01L 21/50 156/256 |
| 6,121,988 | A * | 9/2000 | Uchiyama | H01L 23/4985 347/208 |
| 6,482,664 | B1 * | 11/2002 | Lee | H01L 33/505 438/106 |
| 6,869,813 | B2 * | 3/2005 | Okazaki | H01L 24/97 257/666 |
| 6,943,433 | B2 * | 9/2005 | Kamada | B29C 45/14655 257/666 |
| 7,824,937 | B2 * | 11/2010 | Suehiro | H01L 33/56 237/E21.504 |
| 10,468,337 | B2 * | 11/2019 | Beh | H01L 33/486 |
| 10,522,524 | B2 * | 12/2019 | Lee | H01L 23/4985 |
| 2002/0175621 | A1 * | 11/2002 | Song | H01L 33/641 313/515 |
| 2004/0159850 | A1 * | 8/2004 | Takenaka | H01L 24/97 257/98 |
| 2005/0139846 | A1 * | 6/2005 | Park | H01L 33/62 257/98 |
| 2007/0035969 | A1 * | 2/2007 | Kaneko | G02F 1/133603 362/633 |
| 2008/0191231 | A1 * | 8/2008 | Park | H01L 25/0753 257/98 |
| 2012/0032197 | A1 | 2/2012 | Kurimoto | |
| 2013/0208026 | A1 * | 8/2013 | Suzuki | H01L 33/36 345/690 |
| 2014/0209914 | A1 | 7/2014 | Nagasawa et al. | |
| 2016/0154173 | A1 * | 6/2016 | Lee | H01L 27/15 349/61 |

FOREIGN PATENT DOCUMENTS

| | | |
|---|---|---|
| CN | 103972263 A | 8/2014 |
| CN | 203760002 U | 8/2014 |
| CN | 203800046 U | 8/2014 |
| EP | 2416388 A2 | 2/2012 |
| JP | 11-224063 A | 8/1999 |
| JP | 2001-217464 A | 8/2001 |
| JP | 2007-073752 A | 3/2007 |
| JP | 2008-262993 A | 10/2008 |
| JP | 2011-047977 A | 3/2011 |
| JP | 2012-054533 A | 3/2012 |
| JP | 2012-54533 A | 7/2012 |
| JP | 2014-145857 A | 8/2014 |

OTHER PUBLICATIONS

Office Action for CN Patent Application No. 201680056863.8, dated Feb. 3, 2020, 07 pages of Office Action and 07 pages of English Translation.

* cited by examiner

LIGHT-EMITTING APPARATUS

CROSS REFERENCE TO RELATED APPLICATIONS

This application is a U.S. National Phase of International Patent Application No. PCT/JP2016/076429 filed on Sep. 8, 2016, which claims priority benefit of Japanese Patent Application No. JP 2015-197372 filed in the Japan Patent Office on Oct. 5, 2015. Each of the above-referenced applications is hereby incorporated herein by reference in its entirety.

TECHNICAL FIELD

The disclosure relates to a light-emitting apparatus that includes a plurality of packages each including a plurality of light-emitting elements.

BACKGROUND ART

A display device called a tiling display has been proposed that makes it possible to form a larger display screen. Such a tiling display includes a plurality of packages each including a plurality of light-emitting elements and arrayed, in tight contact with one another in the form of tiles, into a two-dimensional arrangement.

CITATION LIST

Patent Literature

PTL 1: Japanese Unexamined Patent Application Publication No. 2011-47977

SUMMARY OF THE INVENTION

However, a currently-available tiling display forms a non-display region, in which an image is not displayed, in a gap (joint) between packages, causing an issue in which display quality is reduced. To address this, it is desired to narrow the gap between the display panels.

Accordingly, it is desirable to provide a light-emitting apparatus that includes a plurality of packages that are more highly integrated.

A first light-emitting apparatus according to an embodiment of the disclosure includes a plurality of packages each including a first substrate, and a single second substrate on which the plurality of packages are arrayed. Here, the first substrate is provided with a first light source and a second light source. The first light source includes a first light-emitting section that emits light having a first wavelength, and first and second electrodes that are coupled to the first light-emitting section. The second light source includes a second light-emitting section that emits light having a second wavelength, and third and fourth electrodes that are coupled to the second light-emitting section. The second substrate includes first and second connections and a driving circuit. The first connection is coupled to both the first electrode in a first package of the plurality of packages and the first electrode in a second package of the plurality of packages. The second package is adjacent to the first package in a first direction. The second connection is coupled to both the third electrode in the first package and the third electrode in the second package. The driving circuit drives the plurality of packages. It is to be noted that the light-emitting apparatus may include one or more second substrates, and thus may include two or more second substrates.

In the first light-emitting apparatus according to the embodiment of the disclosure, the first and second connections of the second substrate are shared between the first package and the second package. This makes it possible to reduce the number of components, such as connections and wiring lines on the second substrate, compared with a case where first and second connections corresponding to the first package and first and second connections corresponding to the second package are individually provided.

A second light-emitting apparatus according to an embodiment of the disclosure includes a plurality of packages and a second substrate. The plurality of packages each include a first substrate having a first front face and a second rear face. The first front face is provided with a first pixel including a first element, a second pixel including a second element, a first electrode coupled to the first element, and a second electrode coupled to the second element. The second rear face is provided with a wiring layer coupled to both the first electrode and the second electrode. The second substrate is disposed on a second front face facing the second rear face. The second substrate includes a connection coupled to the wiring layer, and a driving circuit driving the plurality of packages.

The second light-emitting apparatus according to the embodiment of the disclosure makes it possible to achieve a more compact configuration.

The light-emitting apparatus according to the embodiments of the disclosure makes it possible to reduce the number of components to be mounted on the second substrate provided with the driving circuit, preferably allowing a larger number of packages to be integrated on the second substrate. Accordingly, the light-emitting apparatus used as a display makes it possible to display an image with higher definition. Moreover, the light-emitting apparatus used as a lighting device makes it possible to illuminate an object at higher luminance. It is to be noted that effects of the disclosure are not limited to those described above, and may be any effects described below.

MODES FOR CARRYING OUT THE INVENTION

In the following, embodiments of the disclosure are described in detail with reference to the drawings. It is to be noted that description is made in the following order.

1. First Embodiment

A light-emitting apparatus including a plurality of packages in each of which one pixel is disposed for a single panel substrate.

2. Second Embodiment

A light-emitting apparatus including a plurality of packages in each of which four pixels are disposed for a single panel substrate.

3. Third Embodiment

A light-emitting apparatus including a plurality of packages each having a multilayered wiring structure.

4. Other Modifications

1. First Embodiment

[Configuration of Light-Emitting Apparatus 1]

Figure 1:
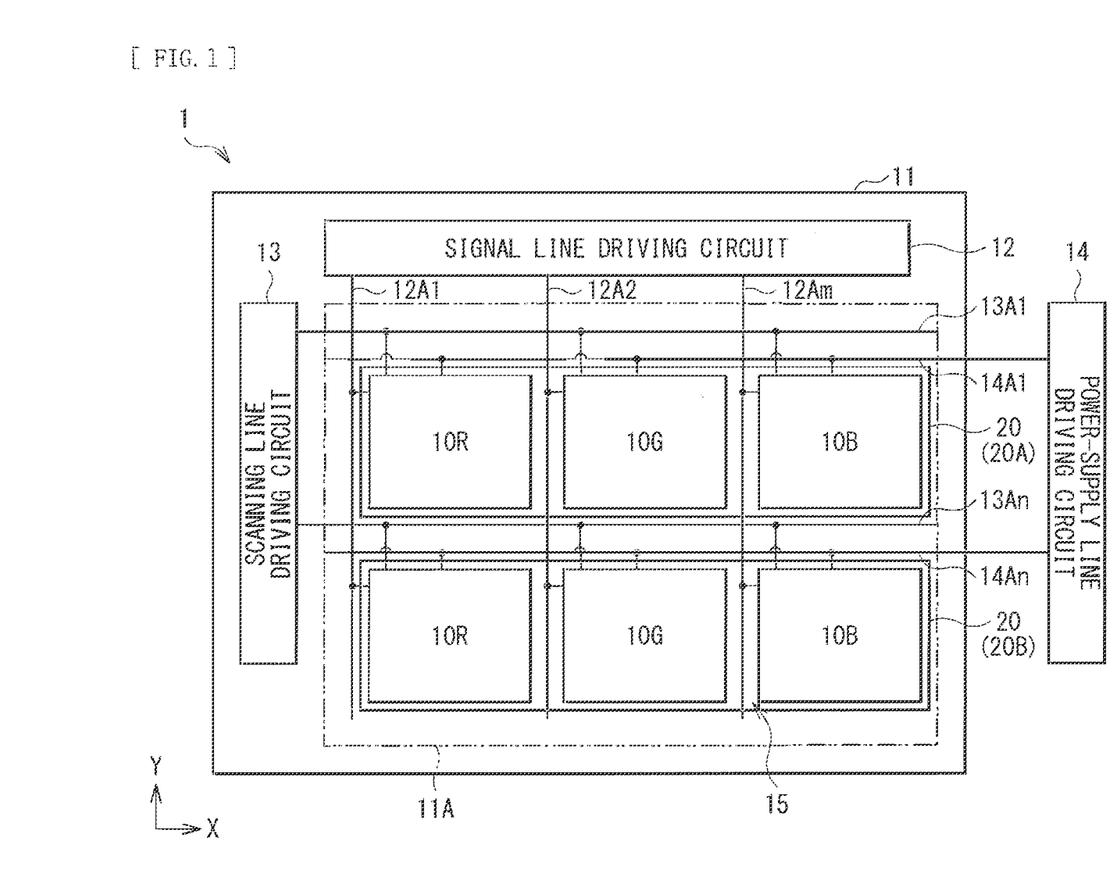
FIG. 1 is a schematic diagram that illustrates an example of entire configuration of a light-emitting apparatus according to a first embodiment of the disclosure.
Figure 2:
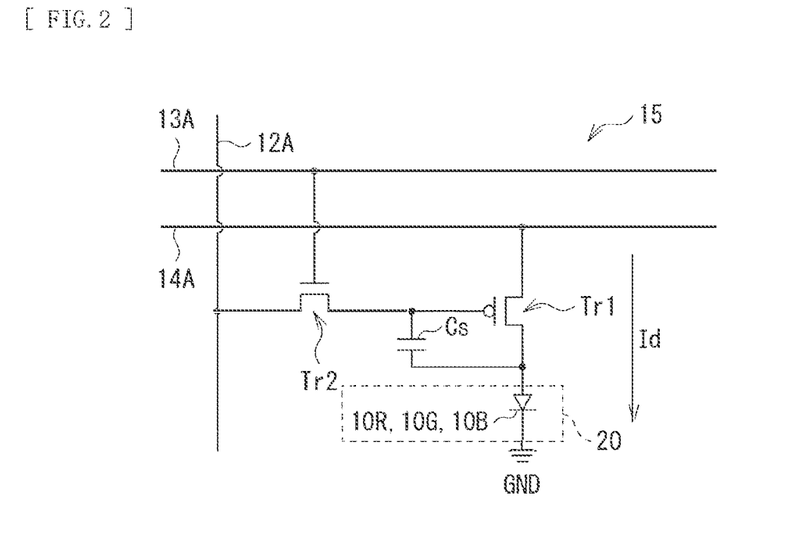
FIG. 2 illustrates an example of a pixel driving circuit illustrated in FIG. 1.
Figure 3A:
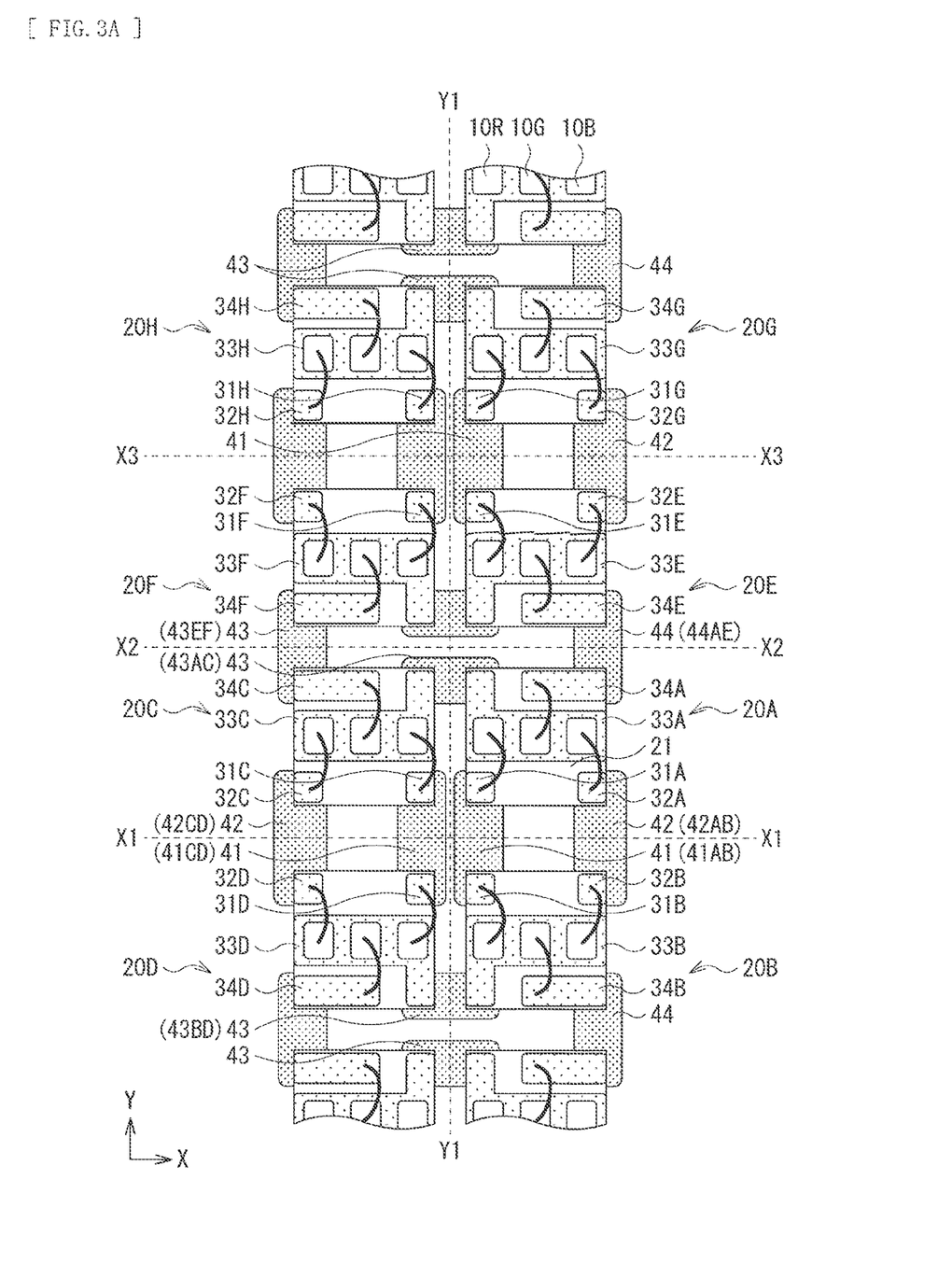
FIG. 3A is a plan view of a portion of a configuration of a light-emitting region illustrated in FIG. 1.
Figure 3B:
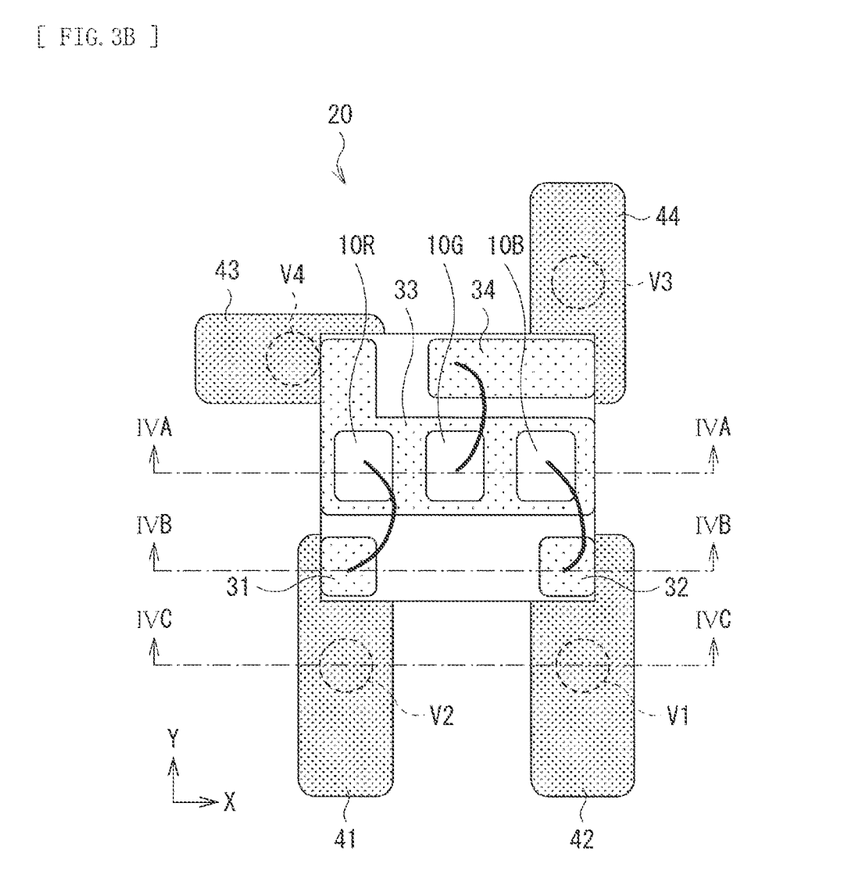
FIG. 3B is an enlarged plan view illustrating, in an enlarged fashion, a package illustrated in FIG. 3A.
Figure 4A:
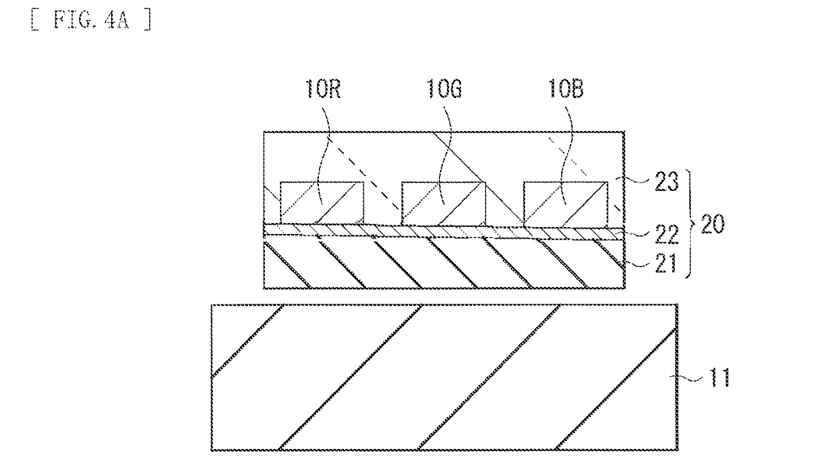
FIG. 4A is an enlarged plan view illustrating, in an enlarged fashion, a cross-section of the package illustrated in FIG. 3B.
Figure 4B:
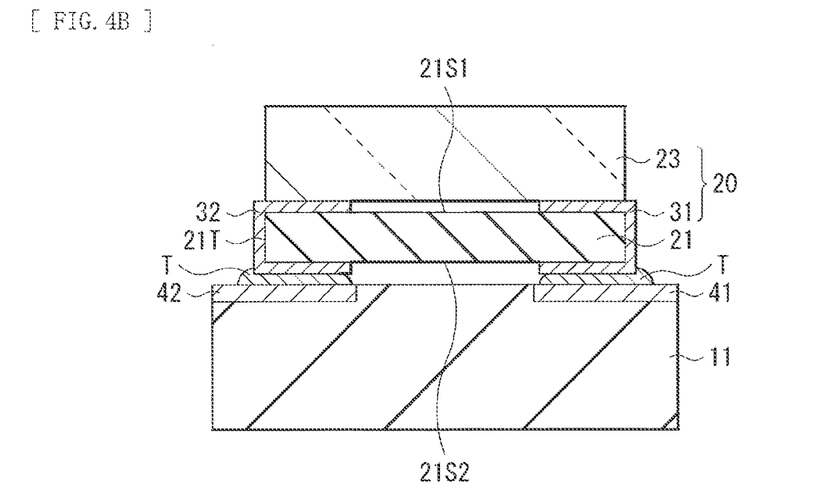
FIG. 4B is another enlarged plan view illustrating, in an enlarged fashion, a cross-section of the package illustrated in FIG. 3B.
Figure 4C:
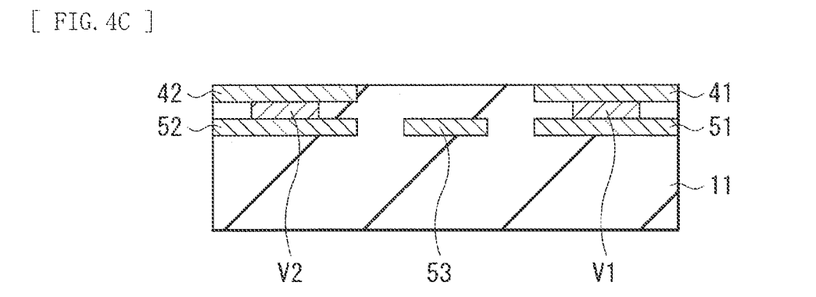
FIG. 4C is an enlarged plan view illustrating, in an enlarged fashion, a cross-section of a region between adjacent packages in the light-emitting region illustrated in FIG. 3A.

FIG. 1 illustrates an entire configuration of a light-emitting apparatus 1 according to a first embodiment of the disclosure. FIG. 2 illustrates an example of a configuration of a pixel driving circuit. FIG. 3A is a plan view illustrating a configuration of a portion of a light-emitting region 11A (described later) of the light-emitting apparatus 1, and FIG. 3B is a plan view illustrating, in an enlarged fashion, of one package 20 (described later) disposed in the light-emitting region 11A. FIG. 4A is a cross-sectional view of the package taken along the line IVA-IVA illustrated in FIG. 3B, FIG. 4B is a cross-sectional view of the package taken along the line IVB-IVB illustrated in FIG. 3B, and FIG. 4C is a cross-sectional view of the package taken along the line IVC-IVC illustrated in FIG. 3B.

The light-emitting apparatus 1 is used as a flat color display apparatus (display device) or a lighting device that emits light in different colors in an interior or exterior space, for example. The light-emitting apparatus 1 includes a plurality of packages 20 arrayed in the light-emitting region 11A of a common substrate 11. The packages 20 each include a plurality of light-emitting elements 10 (10R, 10G, and 10B) on a panel substrate 21 (described later). It is to be noted that FIG. 1 schematically illustrates a manner in which two packages 20A and 20B are arrayed in the Y-direction for the convenience of the space in the drawing. Each of the packages 20A and 20B includes three light-emitting elements 10R, 10G, and 10B that are arrayed in the X-direction. For example, a signal line driving circuit 12, a scanning line driving circuit 13, and a power-supply line driving circuit 14 are disposed around the light-emitting region 11A on the common substrate 11.

As illustrated in FIG. 3A, for example, the plurality of packages 20 arrayed in a two-dimensional matrix are mounted in the light-emitting region 11A on the common substrate 11. Additionally, a pixel driving circuit 15 that drives the light-emitting elements 10 provided in the packages 20 is disposed in the light-emitting region 11A on the common substrate 11. In the pixel driving circuit 15, a plurality of signal lines 12A (12A1, 12A2, . . . 12Am, . . . ) are disposed in a column direction, and a plurality of scanning lines 13A (13A1, . . . , 13An, . . . ) and a plurality of power-supply lines 14A (14A1, . . . , 14An, . . . ) are disposed in a row direction. Any one of the light-emitting elements 10R, 10G, and 10B is disposed correspondingly at each intersection between each signal line 12A and each scanning line 13A. The signal lines 12A are each coupled to the signal line driving circuit 12. The scanning lines 13A are each coupled to the scanning line driving circuit 13. The power-supply lines 14A are each coupled to the power-supply line driving circuit 14.

The signal line driving circuit 12 supplies a signal voltage of an image signal, corresponding to luminance information fed from a signal supply source, to the light-emitting element 10R, 10G, or 10B selected through the corresponding signal line 12A.

The scanning line driving circuit 13 includes, for example, a shift register that shifts (transfers) a start pulse in order in synchronization with a received clock pulse. The scanning line driving circuit 13 scans the light-emitting elements 10R, 10G, and 10B row by row at the time of writing of the image signals to the respective light-emitting elements 10R, 10G, and 10B, and sequentially supplies scanning signals to the scanning lines 13A.

The power-supply line driving circuit 14 includes, for example, a shift register that shifts (transfers) a start pulse in order in synchronization with a received clock pulse. The power-supply line driving circuit 14 properly feeds any of first and second potentials that are different from each other to the power-supply lines 14A in synchronization with the row-by-row scanning performed by the scanning line driving circuit 13. This results in selection of a conduction state or a non-conduction state of a driving transistor Tr1 (described later).

As illustrated in FIG. 2, the pixel driving circuit 15 is an active driving circuit including a driving transistor Tr1, a writing transistor Tr2, a capacitor (retention capacitor) Cs provided between the driving transistor Tr1 and the writing transistor Tr2, and the light-emitting elements 10. The light-emitting element 10 is coupled in series to the driving transistor Tr1 between the power-supply line 14A and a common power-supply line (GND). The driving transistor Tr1 and the writing transistor Tr2 are each configured by a typical thin film transistor (TFT) having a configuration that may be, but not particularly limited to, an inverse-staggered structure (so-called "bottom-gate type") or a staggered structure (top-gate type), for example.

The writing transistor Tr2 has a drain electrode coupled to the signal line 12A, for example, so that the image signal is supplied from the signal line driving circuit 12 to the writing transistor Tr2. In addition, the writing transistor Tr2 also has a gate electrode coupled to the scanning line 13A so that the scanning signal is supplied from the scanning line driving circuit 13 to the writing transistor Tr2. Further, the writing transistor Tr2 also has a source electrode coupled to a gate electrode of the driving transistor Tr1.

For example, the driving transistor Tr1 has a drain electrode coupled to the power-supply line 14A, and is set at the first or second potential from the power supply line driving circuit 14. The driving transistor Tr1 has a source electrode coupled to the light-emitting element 10.

The retention capacitor Cs is provided between the gate electrode of the driving transistor Tr1 (the source electrode of the writing transistor Tr2) and the source electrode of the driving transistor Tr1.

As illustrated in FIG. 3A, the plurality of packages 20 each including the plurality of light-emitting elements 10 are arrayed in a matrix as a whole in the light-emitting region 11A that extends on the XY-plane. In more detail, for example, packages 20E, 20A, and 20B arrayed in line in the Y-direction and packages 20F, 20C, and 20D likewise arrayed in line in the Y-direction are adjacent to each other in the X-direction. It is to be noted that FIG. 3A schematically illustrates some of the packages 20 provided in the light-emitting region 11A, and the number of the packages 20 is not limited thereto.

As illustrated in FIGS. 3B, 4A, and 4B, each of the packages 20 has a structure in which an insulating panel substrate 21 including a material such as ceramic, a wiring layer 22 including electrodes 31 to 34, the light-emitting elements 10 (10R, 10G, and 10B), and a transparent protective film 23 are stacked in order. The light-emitting elements 10R, 10G, and 10B are light-emitting diodes (LEDs) that respectively emit red light, green light, and blue light, and are provided on the common electrode 34. The transparent protective film 23 collectively covers the light-emitting elements 10 and the wiring layer 22 that includes the electrodes 31 to 34, for example. The electrodes 31 to 34 are separated and electrically insulated from one another. Furthermore, the electrodes 31 to 34 each include a portion extending from a top face 21S1 through an end face 21T to a bottom face 21S2 of the panel substrate 21. These electrodes 31 to 34 each have a U-shaped cross-section, for example, as illustrated in FIG. 4B.

Pads 41 to 44 are provided on the uppermost layer of the common substrate 11 at respective positions corresponding to the electrodes 31 to 34. Specifically, the pad 41 is provided at a position partially overlapping the position of the electrode 31 on the XY-plane, the pad 42 is provided at a position partially overlapping the position of the electrode 32 on the XY-plane, the pad 43 is provided at a position partially overlapping the position of the electrode 33 on the XY-plane, and the pad 44 is provided at a position partially overlapping the position of the electrode 34 on the XY-plane. The pads 41 to 44 are electrically coupled to the respective electrodes via connection layers T that include a material such as a solder. As illustrated in FIG. 4C, for example, wiring layers 51 to 53 are embedded in the common substrate 11. For example, the wiring layer 51 is coupled through a via V1 to the pad 41, and the wiring layer 52 is coupled through a via V2 to the pad 42.

As illustrated in FIG. 3B, the light-emitting element 10R is coupled to the electrode 31 and the electrode 33, and emits red light as a result of generation of a predetermined potential difference between the electrode 31 and the electrode 33. Similarly, the light-emitting element 10G is coupled to the electrode 34 and the electrode 33, and emits green light as a result of generation of a predetermined potential difference between the electrode 34 and the electrode 33. The light-emitting element 10B is coupled to the electrode 32 and the electrode 33, and emits blue light as a result of generation of a predetermined potential difference between the electrode 32 and the electrode 33. Although the electrode 33 common to the light-emitting elements 10R, 10G, and 10B is provided here, an electrode may be provided individually for each of the light-emitting elements.

As illustrated in FIG. 3A, for example, the packages 20A and 20B arrayed in the Y-direction have configurations substantially symmetric to each other about the line X1-X1 extending in the X-direction, in the light-emitting apparatus 1. In other words, electrodes 31A and 32A arrayed along the line X1-X1, an electrodes 33A, and an electrode 34A are disposed in this order on the panel substrate 21 in the package 20A. The electrodes 31A and 32A, the electrodes 33A, and the electrode 34A are so disposed as to be remote from the line X1-X1 in the Y-direction. Likewise, electrodes 31B and 32B arrayed along the line X1-X1, an electrode 33B, and an electrode 34B are disposed in order on the panel substrate 21 in the package 20B. The electrodes 31B and 32B, the electrode 33B, and the electrode 34B are so disposed as to be remote from the line X1-X1 in the Y-direction. Here, the pad 41 (41AB) coupled to both the electrodes 31A and 31B and the pad 42 (42AB) coupled to both the electrodes 32A and 32B are disposed between the packages 20A and 20B. The pads 41AB and 42AB are disposed adjacent to each other in the X-direction.

Moreover, in the light-emitting apparatus 1, the package 20C is disposed adjacent to the package 20A in the X-direction, and the package 20D is disposed adjacent to the package 20B in the X-direction. Accordingly, the package 20C and the package 20D are so arranged as to be adjacent to each other in the Y-direction. Here, the pad 43 (43AC) coupled to both the electrodes 33A and 33C is disposed between the packages 20A and 20C. Similarly, the pad 43 (43BD) coupled to both the electrodes 33B and 33D is disposed between the packages 20A and 20C. The pad 43AC and the pad 43BD are disposed at positions substantially symmetric to each other in the Y-direction about the line X1-X1. Additionally, the pad 41 (41CD) coupled to both the electrodes 31C and 31D and the pad 42 (42CD) coupled to both the electrodes 32C and 32D are disposed between the packages 20C and 20D. The pads 41CD and 42CD are so disposed as to be adjacent to each other in the X-direction.

In the light-emitting apparatus 1, the package 20E is disposed on the opposite side of the package 20B across the package 20A in the Y-direction. Furthermore, the package 20F is disposed on the opposite side of the package 20D across the package 20C in the Y-direction. Accordingly, the package 20E and the package 20F are arranged adjacent to each other in the X-direction. Here, the pad 44 (44AE) coupled to both the electrodes 34A and 34E is disposed between the packages 20A and 20E. Similarly, the pad 44 (44CF) coupled to both the electrodes 34C and 34F is disposed between the packages 20C and 20F. Additionally, the pad 43 (43EF) coupled to both electrodes 33E and 33F is disposed between the packages 20E and 20F.

In this way, the packages 20 that are adjacent to each other in the X-direction and Y-direction are so configured that their electrodes 31 to 34 are coupled to the respective common pads 41 to 44. Moreover, in the light-emitting apparatus 1, the packages in which the electrodes 31 to 34 are disposed at equivalent arrangement positions on the panel substrate 21 are alternately arrayed in the Y-direction. Specifically, as illustrated in FIG. 3A, the arrangement positions and shapes of the electrodes 31 to 34 on the panel substrate 21 in the package 20A and the arrangement positions and shapes of the electrodes 31 to 34 on the panel substrate 21 in the package 20G are substantially the same as each other, and the arrangement positions and shapes of the electrodes 31 to 34 on the panel substrate 21 in the package 20B and the arrangement positions and shapes of the electrodes 31 to 34 on the panel substrate 21 in the package 20E are substantially the same as each other. Additionally, the geometry and shapes of the electrodes 31 to 34 on the panel substrate 21 in the packages 20A and 20G and the geometry and shapes of the electrodes 31 to 34 on the panel substrate 21 in the packages 20B and 20E are substantially symmetric about the line X2-X2.

Furthermore, in the light-emitting apparatus 1, the packages 20 arranged in the X-direction have a symmetric arrangement relationship as well. Specifically, as illustrated in FIG. 3A, the geometry and shapes of the electrodes 31 to 34 in the packages 20G, 20E, 20A, and 20B arrayed in the Y-direction and the geometry and shapes of the electrodes 31 to 34 of the packages 20H, 20F, 20C, and 20D arrayed in the Y-direction are substantially symmetric about the line Y1-Y1.

[Workings and Effects of Light-Emitting Apparatus 1]

In the light-emitting apparatus 1 according to the present embodiment, the electrodes 31 to 34 are coupled to the respective common pads 41 to 44 in the packages 20 that are adjacent to each other in the X-direction and Y-direction. Specifically, it is possible, in the package 20, to couple one pixel including the light-emitting elements 10R, 10G, and 10B to the pixel driving circuit 15 through two connections. This makes it possible to reduce the total number of the pads and the number of wiring lines to be provided on the common substrate 11. Consequently, a larger number of packages 20 are allowed to be integrated and mounted on the common substrate 11, compared with a case where the electrodes 31 to 34 of each package 20 are individually coupled to dedicated pads and wiring lines. Accordingly, the light-emitting apparatus 1 used as a display device makes it possible to display an image with higher definition. Moreover, the light-emitting apparatus used as a lighting device makes it possible to illuminate an object at higher luminance.

2. Second Embodiment

Figure 5:
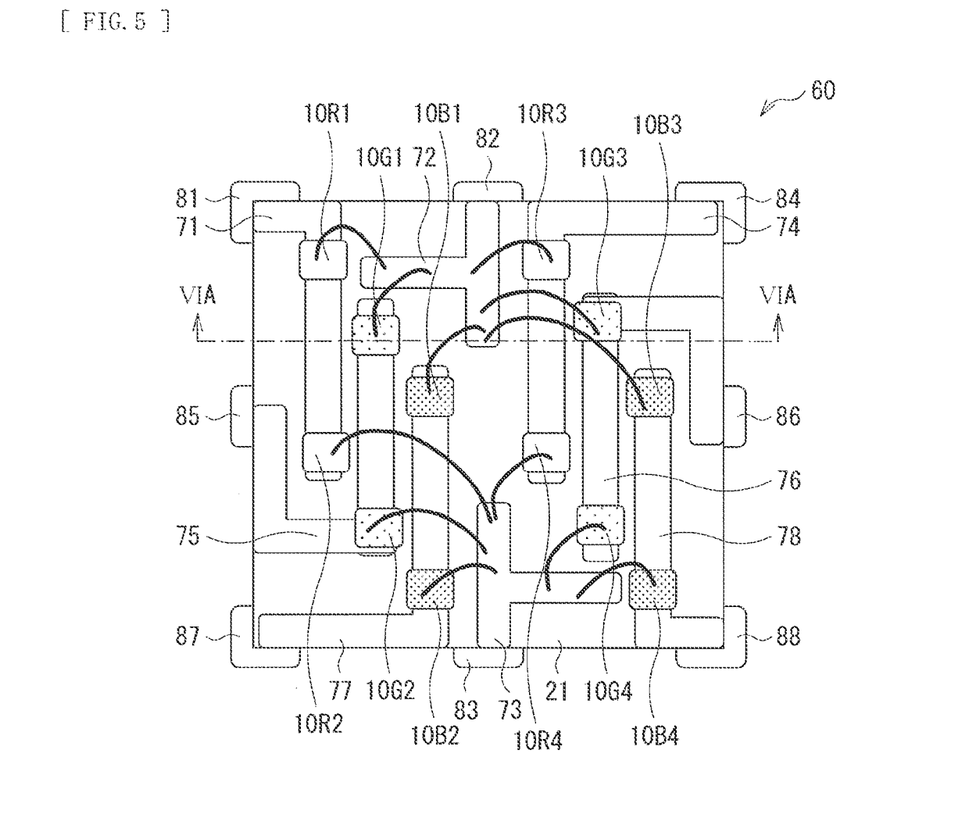
FIG. 5 is a plan view of a package in a light-emitting apparatus according to a second embodiment of the disclosure.

FIG. 5 illustrates an entire configuration of a package 60 of a light-emitting apparatus according to a second embodiment of the disclosure. Although one pixel including the light-emitting elements 10R, 10G, and 10B is provided for the single package 20 in the first embodiment described above, the technology is not limited thereto. The package 60 of the present embodiment includes four pixels disposed on a single panel substrate 21.

Specifically, four light-emitting elements 10R (10R1 to 10R4) that emit red light, four light-emitting elements 10G (10G1 to 10G4) that emit green light, and four light-emitting element 10B (10B1 to 10B4) that emit blue light are disposed on the panel substrate 21.

Here, for example, one end of the light-emitting element 10R1 and one end of the light-emitting element 10R2 are coupled through a common electrode 71 to a pad 81 that is disposed on the common substrate 11. The other end of the light-emitting element 10R1 is coupled through an electrode 72 to a pad 82, and the other end of the light-emitting element 10R2 is coupled through an electrode 73 to a pad 83.

Moreover, for example, one end of the light-emitting element 10R3 and one end of the light-emitting element 10R4 are coupled through a common electrode 74 to a pad 84 that is disposed on the common substrate 11. The other end of the light-emitting element 10R3 is coupled through the electrode 72 to the pad 82, and the other end of the light-emitting element 10R4 is coupled through the electrode 73 to the pad 83.

Furthermore, one end of the light-emitting element 10G1 and one end of the light-emitting element 10G2 are coupled through a common electrode 75 to a pad 85 that is disposed on the common substrate 11. The other end of the light-emitting element 10G1 is coupled through the electrode 72 to the pad 82, and the other end of the light-emitting element 10G2 is coupled through the electrode 73 to the pad 83.

Moreover, one end of the light-emitting element 10G3 and one end of the light-emitting element 10G4 are coupled through a common electrode 76 to a pad 86 that is disposed on the common substrate 11. The other end of the light-emitting element 10G3 is coupled through the electrode 72 to the pad 82, and the other end of the light-emitting element 10G4 is coupled through the electrode 73 to the pad 83.

Furthermore, one end of the light-emitting element 10B1 and one end of the light-emitting element 10B2 are coupled through a common electrode 77 to a pad 87 that is disposed on the common substrate 11. The other end of the light-emitting element 10B1 is coupled through the electrode 72 to the pad 82, and the other end of the light-emitting element 10B2 is coupled through the electrode 73 to the pad 83.

Moreover, one end of the light-emitting element 10B3 and one end of the light-emitting element 10B4 are coupled through a common electrode 78 to a pad 88 that is disposed on the common substrate 11. The other end of the light-emitting element 10B3 is coupled through the electrode 72 to the pad 82, the other end of the light-emitting element 10G4 is coupled through the electrode 73 to the pad 83.

Figure 6A:
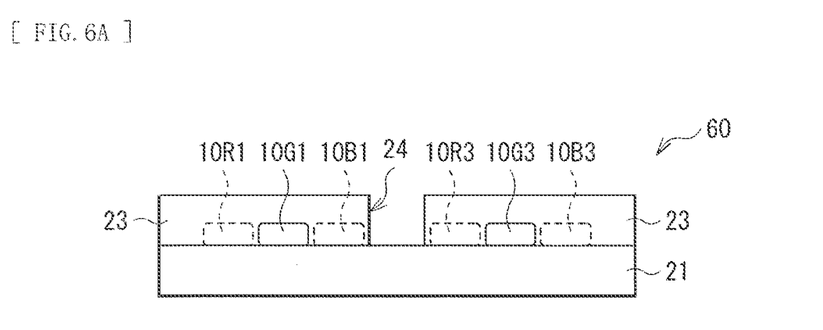
FIG. 6A is a cross-sectional view of the package illustrated in FIG. 5.

As illustrated in FIG. 6A, the package 60 includes a transparent protective film 23 having separators or separation grooves 24 each partitioning adjacent pixels. The separation groove 24 optically separates the adjacent pixels from each other. The separation grooves 24 prevent variation in luminance in a case where a viewer observes from an oblique direction relative to the common substrate 11, for example. It is to be noted that the package 60 may include, for example, a light-shielding film 25 having a light-shielding property on the transparent protective film 23 in place of the separation grooves 24, as with a package 60A illustrated in FIG. 6B. The light-shielding film 25 has openings 25K immediately above and in the vicinity of the light-emitting elements 10R, 10G, and 10B structuring each pixel. The light-shielding film 25 thus limits light that is emitted obliquely.

Figure 6B:
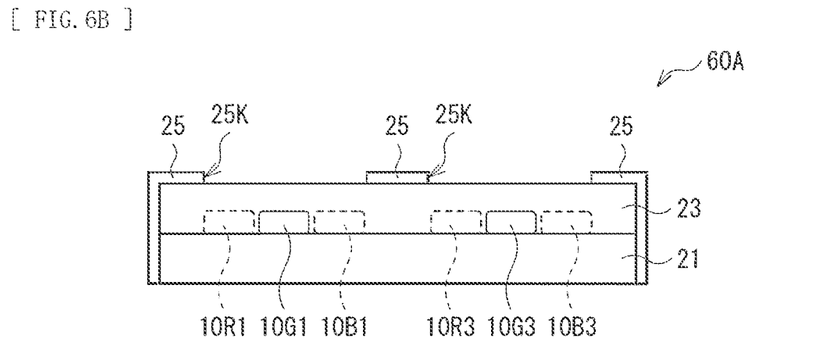
FIG. 6B is a cross-sectional view of a package according to a first modification in the light-emitting apparatus illustrated in FIG. 5.

In this manner, despite including four pixels, it is possible to couple the packages 60 and 60A to the pixel driving circuit 15 provided on the common substrate 11 through the eight connections 81 to 88. Accordingly, providing one connection for one pixel substantially suffices by disposing the packages 60 in a matrix on the common substrate 11 and sharing the connections 81 to 88 between the adjacent packages 60. Consequently, the present embodiment enables higher-density mounting. Moreover, providing the separators, such as the separation grooves 24 or the light-shielding film 25, between the adjacent pixels on one package 60 or 60A makes it possible to suppress apparent variation in luminance when viewed from the oblique direction, enabling high-quality light emission.

Figure 6C:
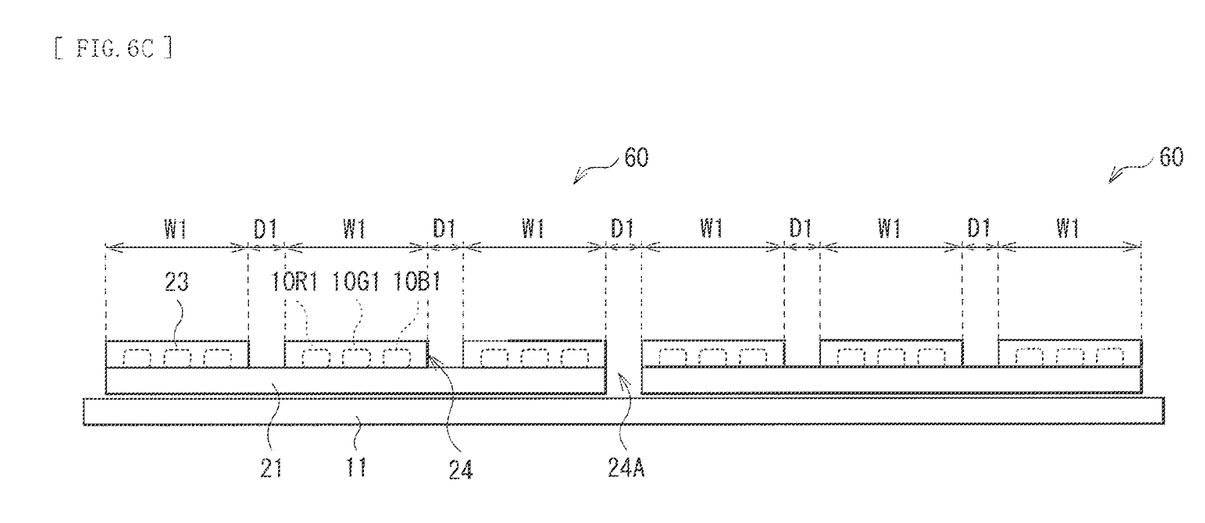
FIG. 6C is a cross-sectional view of a package according to a second modification in the light-emitting apparatus illustrated in FIG. 5.
Figure 6D:
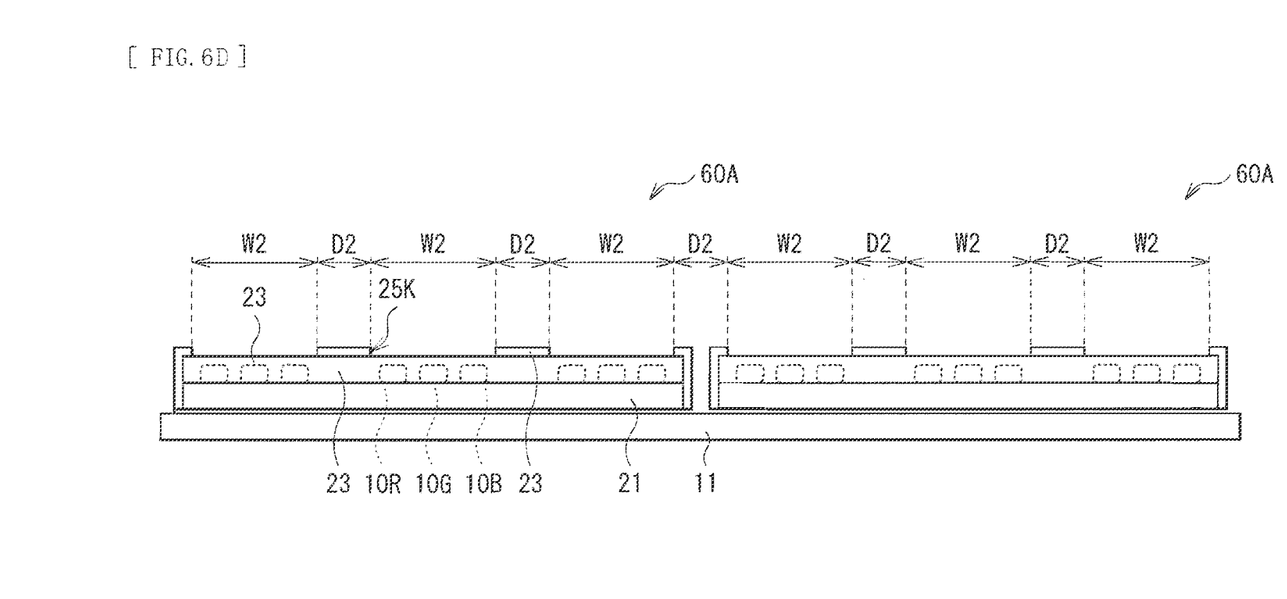
FIG. 6D is a cross-sectional view of a package according to a third modification in the light-emitting apparatus illustrated in FIG. 5.

It is to be noted that all of the separators desirably have a substantially equal width in a direction of connecting the adjacent pixels. This makes it possible to achieve higher integration of the packages and higher-quality displaying. In a case where a plurality of packages 60, including the plurality of pixels, are disposed on the common substrate 11 as illustrated by way of example in FIG. 6C, it is desirable that a width of a gap 24A between the adjacent packages 60 and a width of the separation groove 24 between the adjacent pixels in the package 60 be all substantially equal as well (dimension D1). In this case, it is also desirable that widths of the respective pixels be substantially equal (dimension W1). Furthermore, in a case where a plurality of packages 60A, including the plurality of pixels, are disposed on the common substrate 11 as illustrated by way of example in FIG. 6D, it is desirable that intervals of the adjacent openings 25K be all substantially equal (dimension D2). In this case, it is also desirable that widths of the respective pixels be substantially equal (dimension W2).

It is to be noted that greater variation in width of the separators results in greater unevenness in luminance visually perceptible. Moreover, a portion in which a width of a separator is narrow is visually recognized as a bright line, whereas a portion in which the width of the separator is wide is visually recognized as a dark line. A case where the bright line and the dark line are mixed brings about deterioration in image quality. Accordingly, the variation in width of the separators is desirably within ±3%.

3. Third Embodiment

Figure 7:
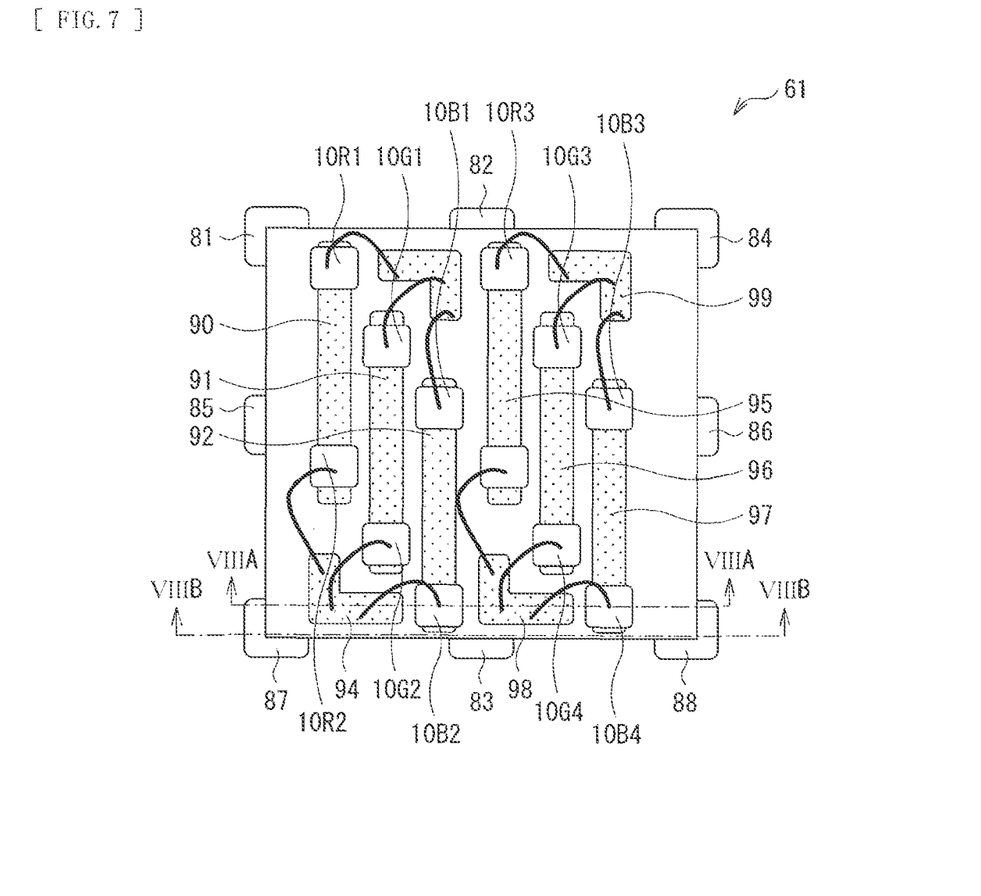
FIG. 7 is a plan view of a package in a light-emitting apparatus according to a third embodiment of the disclosure.
Figure 8A:
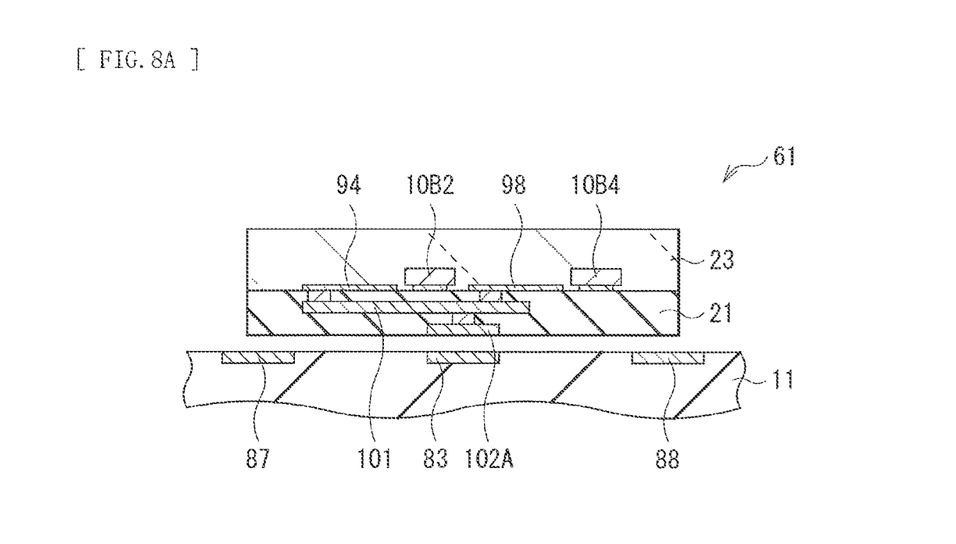
FIG. 8A is a cross-sectional view of the package illustrated in FIG. 7.
Figure 8B:
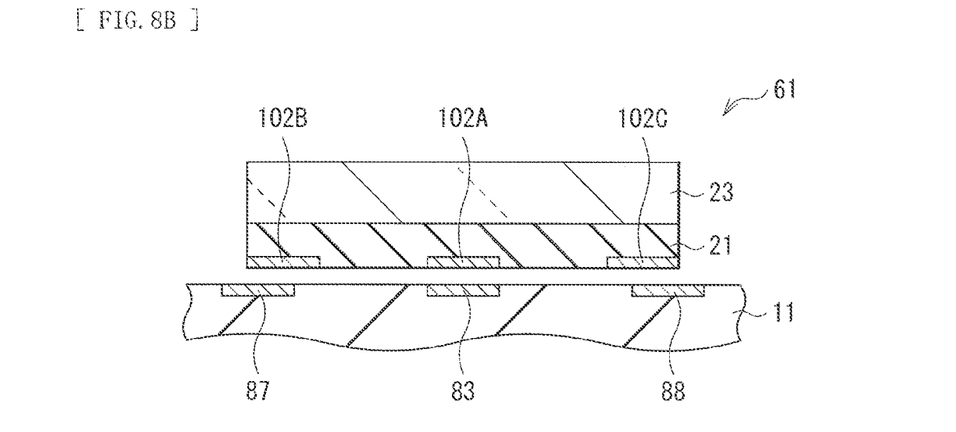
FIG. 8B is another cross-sectional view of the package illustrated in FIG. 7.

FIG. 7 illustrates an entire configuration of a package 61 in a light-emitting apparatus according to a third embodiment of the disclosure. Additionally, FIGS. 8A and 8B are cross-sectional views taken along the lines VIIIA-VIIIA and VIIIB-VIIIB illustrated in FIG. 7. Although all of the electrodes 71 to 78 are provided on the panel substrate 21 in the package 60 according to the second embodiment described above, the technology is not limited thereto. The package 61 according to the present embodiment has a multilayered wiring structure in which electrodes 90 to 99 are disposed on a panel substrate 21 and which includes wiring layers 101 and 102A to 102C that couple these electrodes. This makes it possible to reduce the area of the panel substrate 21 of the package 61 compared with the package 60 of the second embodiment, for example, enabling higher-density mounting.

4. Another Modifications

Although the disclosure has been described above by referring to some embodiments and their modifications, the disclosure is not limited to the above-mentioned embodiments and modifications and may be modified in a variety of ways. For example, the arrangement positions, shapes, and number of the components described in the embodiments and modifications are not limited thereto, and any other arrangement positions, shapes, and number may be adopted. For example, although the package 60 according to the second embodiment includes four pixels disposed on the single panel substrate 21, three or less or five or more pixels may be disposed on a single panel substrate. Additionally, the array directions of the pixels are not limited to a case of two directions orthogonal to each other, and may be any directions.

Moreover, although the light-emitting apparatus including the plurality of light-emitting elements is described in the embodiments and modifications, the technology is not limited thereto. For example, the technology is applicable to a sensor array device that includes, on a common substrate, a plurality of packages in which a plurality of various sensors are disposed in place of the light-emitting elements. The various sensors are, for example, temperature sensors, optical sensors, pressure sensors, or gas sensors. In such a sensor array device, a driving circuit disposed on the common substrate may collect data from each of the sensors in a line sequence.

Moreover, the common substrate may be a flexible substrate including a flexible resin film, for example.

Furthermore, although a case has been described where the light-emitting elements are LEDs in the embodiments and modifications, the light-emitting elements may be semiconductor lasers, for example.

It is to be noted that effects described herein are merely exemplified and not limited to the description thereof. Effects of the disclosure may be any other effects. Moreover, the disclosure may have the following configuration:

(1)

A light-emitting apparatus including:

a plurality of packages each including a first substrate, the first substrate including a first element, a first electrode, a second electrode, a second element, a third electrode, and a fourth electrode, the first electrode and the second electrode being coupled to the first element, the third electrode and the fourth electrode being coupled to the second element; and a single second substrate on which the plurality of packages are arrayed, and including a first connection, a second connection, and a driving circuit, the first connection being coupled to both the first electrode in a first package of the plurality of packages and the first electrode in a second package of the plurality of packages, the second package being adjacent to the first package of the plurality of packages in a first direction, the second connection being coupled to both the third electrode in the first package and the third electrode in the second package, the driving circuit driving the plurality of packages.

(2)

The light-emitting apparatus according to (1), in which the second electrode and the fourth electrode are integrated.

(3)

The light-emitting apparatus according to (1) or (2), in which the plurality of packages further include a third package that is adjacent to the first package in a second direction, the second direction being orthogonal to the first direction, and the second substrate further includes a third connection coupled to all of the second and the fourth electrodes in the first package and the second and the fourth electrodes in the third package.

(4)

The light-emitting apparatus according to (3), in which the plurality of packages further include a fourth package that is adjacent to the third package in the first direction and adjacent to the second package in the second direction, and the second substrate further includes:

a fourth connection coupled to all of the second and the fourth electrodes in the second package and the second and the fourth electrodes in the fourth package;

a fifth connection coupled to both the first electrode in the third package and the first electrode in the fourth package; and a sixth connection coupled to both the third electrode in the third package and the third electrode in the fourth package.

(5)

The light-emitting apparatus according to (1), in which the plurality of packages each include a third element, a fifth electrode, and a sixth electrode, the fifth electrode and the sixth electrode each being coupled to the third element, the plurality of packages further include a fifth package that is disposed on opposite side of the second package across the first package in the first direction, and the second substrate further includes a fifth connection coupled to both the fifth electrode in the first package and the fifth electrode in the fifth package.

(6)

The light-emitting apparatus according to (5), in which the first to the third elements include first to third light-emitting elements that emit respective pieces of light having respective first to third wavelengths.

(7)

The light-emitting apparatus according to any one of (1) to (6), in which the package includes one or more separators optically separating a plurality of pixels from one another, the plurality of pixels each including the first light-emitting section and the second light-emitting section.

(8)

The light-emitting apparatus according to (7), in which the package further includes a transparent protective film covering the plurality of light-emitting portions, and the transparent protective film has, as the separator, a separation groove or a light-shielding film provided between the plurality of pixels that are adjacent to each other.

(9)

The light-emitting apparatus according to (7) or (8), in which a plurality of the separators have respective widths that are substantially equal to each other in a direction that connects the plurality of pixels that are adjacent to each other.

(10)

A light-emitting apparatus including:

a plurality of packages each including a first substrate, the first substrate including a first front face and a second rear face, the first front face including a first pixel having a first element, a second pixel having a second element, a first electrode coupled to the first element, and a second electrode coupled to the second element, the second rear face including a wiring layer coupled to both the first electrode and the second electrode; and a second substrate provided on a second front face that faces the second rear face, and including a connection and a driving circuit, the connection being coupled to the wiring layer, the driving circuit driving the plurality of packages.

This application claims the benefit of Japanese Priority Patent Application JP2015-197372 filed with the Japan Patent Office on Oct. 5, 2015, the entire contents of which are incorporated herein by reference.

It should be understood by those skilled in the art that various modifications, combinations, sub-combinations, and alterations may occur depending on design requirements and other coefficients insofar as they are within the scope of the appended claims or the equivalents thereof.

The invention claimed is:

1. A light-emitting apparatus, comprising:
a plurality of packages, wherein
each of the plurality of packages includes a first substrate, at least one pixel, a first electrode, a second electrode, a third electrode, and a fourth electrode,
the at least one pixel includes a first element and a second element,
the first electrode, the second electrode, the third electrode, the fourth electrode, and the at least one pixel are arranged on the first substrate,
the first electrode and the second electrode are coupled to the first element, and
the third electrode and the fourth electrode are coupled to the second element;
a second substrate on which the plurality of packages are arrayed, wherein the second substrate includes a first connection and a second connection; and
a driving circuit included in the second substrate, wherein
the first connection is coupled to the first electrode in a first package of the plurality of packages and to the first electrode in a second package of the plurality of packages,
the second package is adjacent to the first package in a first direction,
the second connection is coupled to the third electrode in the first package and to the third electrode in the second package, and
the driving circuit is configured to drive the plurality of packages.

2. The light-emitting apparatus according to claim 1, wherein
the second electrode and the fourth electrode are integrated.

3. The light-emitting apparatus according to claim 1, wherein
the plurality of packages further includes a third package that is adjacent to the first package in a second direction,
the second direction is orthogonal to the first direction, and
the second substrate further includes a third connection coupled to the second electrode and the fourth electrode in the first package and to the second electrode and the fourth electrode in the third package.

4. The light-emitting apparatus according to claim 3, wherein
the plurality of packages further includes a fourth package,
the fourth package is adjacent to the third package in the first direction and adjacent to the second package in the second direction, and
the second substrate further includes:
a fourth connection coupled to the second electrode and the fourth electrode in the second package and to the second electrode and the fourth electrode in the fourth package;
a fifth connection coupled to the first electrode in the third package and the first electrode in the fourth package; and
a sixth connection coupled to the third electrode in the third package and the third electrode in the fourth package.

5. The light-emitting apparatus according to claim 1, wherein
each of the plurality of packages further includes a third element, a fifth electrode, and a sixth electrode,
each of the fifth electrode and the sixth electrode is coupled to the third element,
the plurality of packages further includes a fifth package on an opposite side of the second package across the first package in the first direction, and
the second substrate further includes a fifth connection coupled to the fifth electrode in the first package and to the fifth electrode in the fifth package.

6. The light-emitting apparatus according to claim 5, wherein
each of the first element, the second element, and the third element comprises a first light-emitting element, a second light-emitting element, and a third light-emitting element, and
each of the first light-emitting element, the second light-emitting element, and the third light-emitting element is configured to emit light having a respective wavelength.

7. The light-emitting apparatus according to claim 1, wherein
each of the plurality of packages further includes a plurality of separators,
each of the plurality of separators is configured to optically separate a plurality of pixels, and
each of the plurality of pixels includes a first light-emitting section and a second light-emitting section.

8. The light-emitting apparatus according to claim 7, wherein
each of the plurality of packages further includes a transparent protective film which covers the first light-emitting section and the second light-emitting section, and
the transparent protective film has, as a separator, one of a separation groove or a light-shielding film between an adjacent pair of pixels among the plurality of pixels.

9. The light-emitting apparatus according to claim 7, wherein
each of the plurality of the separators has a respective width from a plurality of widths, and
each of the plurality of widths is substantially same in a direction that connects the plurality of pixels that are adjacent to each other.

10. A light-emitting apparatus, comprising:
a plurality of packages, wherein
each of the plurality of packages includes:
a first substrate, wherein
the first substrate includes a front face and a rear face,
the front face includes a first pixel having a first element, a second pixel having a second element, a first electrode coupled to the first element, and a second electrode coupled to the second element,
the first electrode and the second electrode extend from the front face to the rear face, and
the rear face includes a wiring layer coupled to the first electrode and the second electrode; and
a transparent protective film on the front face which covers the first pixel, the second pixel, and the wiring layer, wherein
the transparent protective film has, as a separator, one of a separation groove or a light-shielding film between the first pixel and the second pixel;
a second substrate that faces the rear face, wherein the second substrate includes a connection; and
a driving circuit included in the second substrate, wherein
the connection is coupled to the wiring layer, and
the driving circuit is configured to drive the plurality of packages.

11. A light-emitting apparatus, comprising:
a plurality of packages, wherein
each of the plurality of packages includes a first substrate, at least one pixel, a first electrode, a second electrode, a third electrode, and a fourth electrode,
the at least one pixel includes a first element and a second element,
the first electrode, the second electrode, the third electrode, the fourth electrode, and the at least one pixel are arranged on the first substrate,
the first electrode and the second electrode are coupled to the first element,
the third electrode and the fourth electrode are coupled to the second element,
each of the plurality of packages further includes at least one separator;
the at least one separator is configured to optically separate a first adjacent pair of pixels among a plurality of pixels,
each of the plurality of pixels includes a first light-emitting section and a second light-emitting section,
each of the plurality of packages further includes a transparent protective film which covers the first light-emitting section and the second light-emitting section, and
the transparent protective film has, as a separator, one of a separation groove or a light-shielding film between a second adjacent pair of pixels among a plurality of adjacently placed pixels;
a second substrate on which the plurality of packages are arrayed, wherein the second substrate includes a first connection and a second connection; and
a driving circuit included in the second substrate, wherein
the first connection is coupled to the first electrode in a first package of the plurality of packages and to the first electrode in a second package of the plurality of packages,
the second package is adjacent to the first package in a first direction,
the second connection is coupled to the third electrode in the first package and to the third electrode in the second package, and
the driving circuit is configured to drive the plurality of packages.

* * * * *